United States Patent [19]

Nagasawa et al.

[11] Patent Number: 4,551,908
[45] Date of Patent: Nov. 12, 1985

[54] PROCESS OF FORMING ELECTRODES AND INTERCONNECTIONS ON SILICON SEMICONDUCTOR DEVICES

[75] Inventors: Eiji Nagasawa; Hidekazu Okabayashi; Mitsutaka Morimoto; Kohei Higuchi, all of Tokyo, Japan

[73] Assignee: Nippon Electric Co., Ltd., Tokyo, Japan

[21] Appl. No.: 657,080

[22] Filed: Oct. 2, 1984

Related U.S. Application Data

[63] Continuation of Ser. No. 388,544, Jun. 15, 1982, abandoned.

[30] Foreign Application Priority Data

Jun. 15, 1981 [JP] Japan .................. 56-91829
Nov. 11, 1981 [JP] Japan .................. 56-180518
Feb. 10, 1982 [JP] Japan .................. 57-19923
Feb. 12, 1982 [JP] Japan .................. 57-20908
Feb. 12, 1982 [JP] Japan .................. 57-20909

[51] Int. Cl.$^4$ .................. H01L 21/265; H01L 21/28
[52] U.S. Cl. .................. 29/571; 29/576 B; 29/578; 29/591; 148/1.5; 148/187; 148/188
[58] Field of Search .................. 29/571, 576 B, 578, 29/591; 148/1.5, 187, 188

[56] References Cited

U.S. PATENT DOCUMENTS

| 4,204,894 | 5/1980 | Komeda et al. | 148/188 |
| 4,297,782 | 11/1981 | Ito | 29/571 |
| 4,313,256 | 2/1982 | Widmann | 29/578 X |
| 4,319,395 | 3/1982 | Lund et al. | 29/576 B |
| 4,339,869 | 7/1982 | Reihl et al. | 29/576 B |
| 4,343,082 | 8/1982 | Lepselter et al. | 29/571 X |
| 4,349,395 | 9/1982 | Toyokura et al. | 29/576 B |

OTHER PUBLICATIONS

Sinha et al., *J. of Electrochem. Soc.*, vol. 120, No. 12, Dec. 1973, pp. 1767-1771.
Chiang et al., *J. of Appl. Phys.*, vol. 52, No. 6, Jun. 1981, pp. 4,027-4,032.
Nagasawa et al., *Jpn. J. of Applied Physics*, vol. 22, No. 1, Jan. 1983, pp. L57-L59.
Higuchi et al., *Jpn. J. of Applied Physics*, vol. 22, Suppl. 22-1, 1982, pp. 609 and 610.

*Primary Examiner*—George T. Ozaki
*Attorney, Agent, or Firm*—Blakely, Sokoloff, Taylor & Zafman

[57] ABSTRACT

A process of forming electrodes and interconnections in a silicon semiconductor device comprises the steps of forming an insulating film on a silicon substrate, defining an opening in the insulating film, depositing a layer of metal having a high melting point on the insulating film, implanting ions to mix an interface between the metal layer and the silicon substrate, heating the construction in a temperature in the range of from 400 to 650 degrees Celsius to form a silicide of the metal layer in the opening, and selectively etching away an unreacted metal layer so as to self-align the silicide metal layer with the opening. The silicide metal layer is then annealed in a non-reducing gas atmosphere at a temperature ranging from 800 to 1,100 degrees Celsius.

7 Claims, 16 Drawing Figures

PROCESS OF FORMING ELECTRODES AND INTERCONNECTIONS ON SILICON SEMICONDUCTOR DEVICES

This is a continuation of application Ser. No. 388,544 filed June 15, 1982, now abandoned.

BACKGROUND OF THE INVENTION

The present invention relates to a process of forming electrodes and interconnections on silicon semi-conducor devices, and more particularly to a process of rendering less resistive thin layers of polycrystalline silicon or thin impurity-doped layers which are employed as interconnections in high-speed, high-density large scale integrated circuits, and of forming thermally resistant ohmic electrodes for the impurity-doped layers.

To meet the demands for higher density and higher-speed operation, great efforts have continuously been made to reduce the three-dimensional size of MOS LSI devices according to the scaling law. The trend for smaller devices has led to reduced thicknesses of gate electrode interconnections and impurity-doped layers which serve as interconnections formed on silicon substrates. The thinner interconnection layers have, however, resulted in increased sheet resistivity, which has prevented devices from operating at higher speeds. To solve the problem, there have been proposed a process of covering the surface of an impurity-doped layer with a metal silicide having a low electric resistance, and a gate electrode construction formed of a high-melting-point metal or its silicide rather than polycrystalline silicon, or of polycrystalline silicon covered with a thin layer of metal silicide. The metal silicide used is required to be lower in resistance than the impurity-doped layer, to be thermally resistant up to at least about 1,000 degrees Celsius, and to be formed as a layer uniformly self-aligned with respect to the impurity doped layer, contact holes and pattern of interconnections. It is also desirable that the area where the metal silicide is held in contact with a layer of aluminum be thermally resistant up to at least about 500 degrees Celsius. One known process of forming a thin film of metal silicide on a silicon substrate or on a thin film of silicon comprises the steps of depositing a metal film on silicon to provide a metal/silicon construction, and then merely annealing the composite construction to cause silicide forming reaction to take place at an interface. Since silicide forming reaction between precious metal such as platinum and silicon can easily proceed during annealing at a relatively low temperature of less than 500 degrees Celsius, the above fabrication process has been studied for the production of a silicide of precious metal for the foregoing applications.

However, as reported by A. K. Sinha et al. in Journal of Applied Physics, Vol. 43, No. 9, Pages 3637–3643, 1972, a precious metal silicide has a relatively low melting point and hence is poor in thermal resistance. The annealing step for the silicide formed therefore needs to be effected at a temperature lower than approximately 800 degrees Celsius. Furthermore, P. C. Parekh et al. have pointed out in Solid State Electronics, Vol. 19, Pages 493–494, 1976, that a precious metal silicide starts reacting with aluminum at a relatively low temperature lower than 350 degrees Celsius. These shortcomings could be eliminated by employing a metal silicide having a high melting point such as a silicide of molybdenum which can withstand annealing at about 1,000 degrees Celsius and which will start reacting with aluminum at a relatively high temperature about 500 degrees Celsius. However, where a silicon substrate is doped at its surface with impurities such as arsenic or phosphorus at a high density, a metal having a high melting point is often liable to fail to get silicide forming reaction even if annealed at a high temperature in the vicinity of 1,000 degrees Celsius. Therefore, the silicide forming reaction using a high-melting-point metal under the above condition sometimes fails to progress. Even a silicide which has successfully been formed through such reaction is extremely poor in uniformity and flatness of the surface and an interface between the silicide and silicon, and hence finds difficulty in application to devices. The silicide thus formed also fails to become self-aligned with contact holes, as reported by R. W. Bower et al. in Applied Physics Letters, Vol. 20, No. 9, Pages 359–361, 1972, and by A. K. Shinha et al. in Journal of Electrochemical Society, Vol. 120, No. 12, Pages 1767–1771, 1972.

Figure 1:
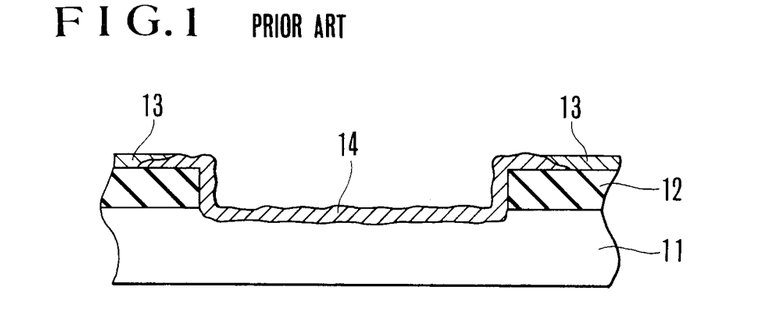
FIG. 1 is a fragmentary cross-sectional view of a conventional silicon semiconductor device including a silicide of metal having a high melting point extending onto an insulting film on a silicon substrate around a hole defined in the insulating film, the metal being formed into the silicide by being deposited on the insulating film and annealed in vacuum at a temperature of 625 degrees Celsius.

More specifically, as shown in FIG. 1 of the accompanying drawings, a silicide 14 of metal having a high melting point is formed by forming an opening in an insulating film 12 formed on the surface of a silicon substrate 11, depositing a metal having a high melting point over the entire surface to form a film/3, and annealing the deposited film 13 at 625° C. in a vacuum. Such a silicide layer 14, however, is not confined within the contact hole, but spreads out onto the insulating film around the contact hole.

As an alternative to the above annealing process, there has been proposed in recent years a process of forming a metal silicide by implanting ions into a metal/silicon construction under the condition that its interface is mixed together. S. W. Chiang et al. have reported in Journal of Applied Physics, Vol. 52, No. 6, Pages 4,027–4,032, June 1981, that phosphorus ions are implanted into a molybdenum/silicon structure to form a silicide of molybdenum. The article has described that such a silicidizing reaction is more repeatable, and the resultant silicide remains uniform upon annealing at 850 degrees Celsius. However, the uniformity of the silicide becomes extremely poor when subjected to annealing at a higher temperature, such as 1,000 degrees Celsius. Such a non-uniform silicide is by no means suited for rendering less resistive thin impurity-doped layers in small-sized MOS LSI. This paper is silent as to self-alignment of the silicide which is required for high-density circuit construction, that is, whether the silicide spreads out of a contact hole.

Figure 2:
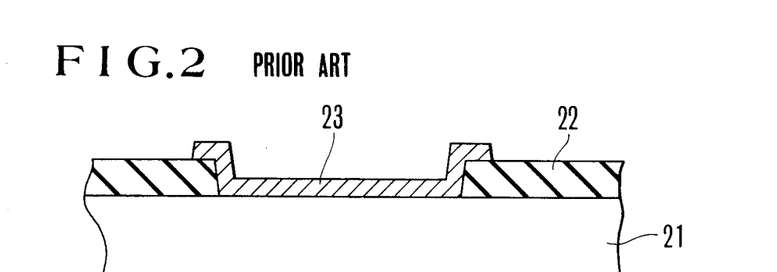
FIG. 2 is a fragmentary cross-sectional view of another known silicon semiconductor device, showing a circular diode pattern prior to ion implantation, the device being used by S. W. Chiang et al. in an experiment for forming a molybdenum silicide by implanting ions into a molybdenum/silicon structure.

S. W. Chiang et al. used a structure as shown in FIG. 2 for their experiments. The structure includes a substrate 21 of n-type silicon having a resistivity of 1–4 $\Omega$cm, and a silicon oxide film 22 having a thickness of 6,000 Å formed on the silicon substrate 21. After the oxidized-silicon film 22 has been formed on the silicon substrate 21, a large circular hole having a diameter of 0.65 mm is defined in the film 22. Then, a film 23 which is 1,000 Å thick is deposited on the silicon oxide film 22 entirely over its surface by way of DC magnetron sputtering, the film 23 being made of molybdenum. The molybdenum film 23 is then patterned by photoetching to a 0.76 mm diameter circular form which is concentrical with the circular hole in the silicon oxide film 22. Thereafter, phosphorus ions are implanted for mixing the interface between the molybdenum and silicon layers, and annealed in an H$_2$ gas atmosphere at a temperature of 850 degrees Celsius or more. The present inventors however have experimentally found that under the above annealing condition, the silicide formed is not self-aligned with the circular hole along its edge and has a margin extending over the silicon oxide film around the circular hole. The report presented by S. W. Chiang et al. contained no description about behavior of the silicidizing reaction at the edge of the circular hole. Considering the fact that the film 23 of molybdenum is positioned by photoetching with respect to the circular hole so that the film 23 is patterned to have its margin extending over the film 22 around the circular hole, S. W. Chiang et al. did not appear to intend to cause the silicide to be self-aligned with the circular hole. The circular opening defined in the silicon oxide film 22 is so roughly and largely sized that it will not match a highly compact and complex LSI pattern, and does not appear to be well calculated for application to actual small-sized LSI devices.

SUMMARY OF THE INVENTION

It is an object of the present invention to provide a process of fabricating a silicide of metal having a high melting point which will be uniform even after being annealed at a temperature of about 1,000 degrees Celsius, and which is formed in self-alignment with an exposed surface of silicon. The high melting point metal used by way of example herein is molybdenum. However, it will be obvious to those skilled in the art that other high melting point metals, such as wolfram (tungsten), titanium and tantalum can be used instead in the disclosed and claimed process.

The inventors have made the present invention based on the finding that the selection of a temperature and a gas atmosphere upon annealing subsequent to interface mixing in a high-melting-point metal/silicon construction by ion implantation has a great effect on the formation of a silicide of metal having a high melting point which is kept uniform at higher temperatures and self-aligned an exposed surface of silicon.

According to the present invention, a process of forming a layer of metal silicide having a high melting point on a major surface of a semiconductive substrate of silicon, comprises the steps of forming an insulating film on the major surface of the silicon substrate, defining an opening in the insulating film, depositing a layer of metal having a high melting point over the major surface of the silicon substrate, implanting ions so as to mix an interface between the metal layer and the silicon substrate, thereafter heating the metal layers in a temperature range of from 400 to 650, preferably 400 to 600 degrees Celsius, to effect a silicide forming reaction for the metal of high melting point at the opening, selectively etching away the metal layer which remains on the insulating film and not subjected to the silicide forming reaction so as to self-align the silicide layer of metal with the opening, and then annealing the silicide layer in a non-reducing gas atmosphere at a temperature ranging from 800 to 1,100 degrees Celsius.

The ions to be implanted may comprise dopant ions of group III or V elements to fabricate a double-layer construction including a uniform layer of metal silicide having a high melting point and a doped layer which are self-aligned with the opening and are in contact with uniform layer of metal silicide having a high melting point. The ions to be implanted may otherwise comprise non-dopant ions of silicon to form an uniform layer of metal silicide having a high melting point which is self-aligned with the opening. Alternatively, the ions to be implanted may comprise both dopant ions such as boron, phosphorus and arsenic ions and non-dopant ions such as silicon and argon ions to fabricate a double-layer structure including a uniform layer of metal silicide having a high melting point and a thin doped layer which are self-aligned with the opening and is in contact with the uniform layer of metal silicide.

With the fabrication process according to the present invention, the layer of silicide metal having a high melting point remains uniform even after being annealed at a temperature of about 1,000 degrees Celsius and is self-aligned with the exposed surface of the silicon substrate. These properties such as uniformity and self-alignment are indispensable for the fabrication of highly integrated circuits.

It has been found that the temperature and gas atmosphere in which the silicide layer is annealed after the interface has been mixed by ion implantation are quite important in gaining the above properties. More specifically, a metal of high melting point, such as molybdenum, wolfram (tungsten), titanium and tantalum should preferably be annealed in a reducing atmosphere such as of $H_2$ gas to prevent oxidation. It has turned out that when a silicide of molybdenum is annealed for approximately twenty to thirty minutes in an $H_2$ gas atmosphere at a temperature higher than 650 degrees Celsius, the molybdenum silicide has its margin extending onto the insulating film around the opening and hence is not self-aligned with the opening. When the silicide of molybdenum is annealed in an $H_2$ gas atmosphere in a temperature range of from 400 to 650 degrees Celsius, preferably 400 to 600 degrees Celsius, no portion of the molybdenum silicide gets out of the opening, and the molybdenum silicide is rendered self-aligned with the opening. It is important for self-alignment that the metal layer be heated in low-temperature annealing at a temperature ranging from 400 to 650 degrees Celsius and then the metal layer of high melting point which is not subjected to the silicide forming reaction be removed from the insulating film. After the self-aligned silicide has been formed, the silicide should be annealed at a high temperature up to 1,000 degrees Celsius, to render the silicide less resistive. The gas atmosphere used in this high temperature annealing should preferably comprise a non-reducing atmosphere such as of $N_2$ gas, but not a reducing atmosphere such as of $H_2$ so as to maintain the silicide surface uniformity obtained by the low temperature silicidizing annealing. Therefore silicide of metal having a high melting point which is better in uniformity and self-alignment, such as the one according to the present invention, could not be formed by a prior art process, as reported by S. W. Chiang, which comprises the steps of implanting ions for interface mixing and then annealing a silicide in a $H_2$ gas atmosphere at a temperature of 850 degrees Celsius or higher.

Where group III or V dopant ions are implanted, they serve to mix the interface between the metal of high melting point and the silicon and also to dope impurities, with the result that there is fabrication a double-layer construction including a uniform layer of metal silicide having a high melting point and a doped layer which are self-aligned with the opening. Relatively light ions such as boron ions are required for sufficient interface mixing to be implanted in more quantities than heavier ions such as As. When a large quantity of boron ions are implanted, however, the doped layer becomes too thick. Therefore, to form a thin layer doped with light ions such as boron, it is more advantageous to effect interface mixing by implanting relatively heavy non-dopant ions of silicon or the like, and then to additionally implant a relatively small quantity of desired dopant ions.

The double-layer construction as formed by the above process is quite stable even after being annealed at a high temperaure. A direct (ohmic) contact, including an interconnection which is deposited on the double-layer construction and serves as both an Mo electrode and a gate is thermally resistant up to about 950 degrees Celsius, while a conventional Mo direct contact comprising Mo/n+Si is thermally resistant only up to about 700 degrees Celsius. With the double-layer construction having a sheet resistivity dependent on the silicidized layer, a low sheet resistivity can be maintained for a sufficiently thin doped layer which is 0.2 $\mu$m or less thick. The uniform silicide of a high melting point according to the present invention serves as an excellent barrier with respect to aluminum. Such features make the construction best suited for use as source and drain electrodes of a submicron MOSFET.

The fabrication process of the present invention is also applicable to the fabrication of a layer of silicide metal having a high melting point in self-alignment with patterned polycrystalline silicon. In such an application, a MOSFET can be fabricated which has a gate electrode composed of a silicide of metal having a high melting point which covers polycrystalline silicon. The process of fabricating such a MOSFET comprises the steps of forming an insulating film on a semiconductor substrate of silicon, forming a film of polycrystalline silicon doped with impurities on the insulating film, patterning the film of polycrystalline silicon, then depositing a layer of metal having a high melting point thereon entirely over the surface thereof, implanting ions so as to mix an interface between the metal layer and the film of polycrystalline silicon, annealing the metal layer at a temperature ranging from 400 to 650 degrees Celsius, preferably 400 to 600 degrees Celsius, to effect a silicide forming reaction for the metal layer at the mixed interface, selectively etching away the metal layer which is not subjected to the silicide forming reaction so as to self-align the layer of silicide metal with the patterned film of polycrystalline silicon, and subsequently annealing the layer of silicide metal in a non-reducing atmosphere at a temperature of 800 degrees Celsius or higher.

Under customary practice, a gate electrode of a double-layer construction having polycrystalline silicon covered with a metal silicide is formed by directly etching two films extending over the entire surface of a silicon substrate. Thus, two etching processes having different etching rates are necessary, which require various measures to be taken. According to the present invention, only an electrode and an interconnection which are of polycrystalline silicon may be patterned by the known silicon gate patterning process which is widely used today. There may be added to the foregoing double-layer gate fabrication process the step of removing a gate insulating film by using a gate electrode and interconnection as a mask for thereby exposing surfaces of the silicon substrate which serve as a source and a drain, between the steps of patterning the gate interconnection and forming the metal of a high melting point, whereby a MOSFET capable of high-speed operation can be fabricated which is of such a construction that the entire surfaces of the source and drain electrodes and the gate of polycrystalline silicon are covered with a silicide of metal having a high melting point.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

According to a first embodiment, the present invention is applied to the fabrication of a direct contact for an interconnection of a metal having a high melting point. The term "direct contact" as used herein relates to a construction wherein a portion of a gate electrode or interconnection of a metal having a high melting point forms an ohmic contact in a given region of a silicon substrate which is doped at a high density. The present invention will first be described with reference to an n-channel, molybdenum gate MOSFET, whose gate electrode makes direct ohmic contact with a source in a depletion-type transistor case or with a drain in an enhancement-type transistor. Such a MOSFET is usually used as a load transistor in an inverter circuit.

Figure 3A:
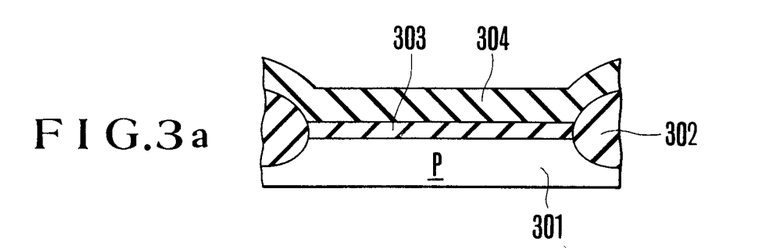
FIGS. 3a through 3f are fragmentary cross-sectional views illustrative of progressive steps in a process of fabricating a molybdenum gate MOSFET with a direct contact between a gate and source which has a silicate layer of metal having a high melting point in accordance with an embodiment of the present invention.
Figure 3B:
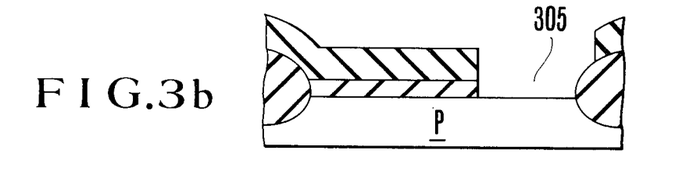
Figure 3C:
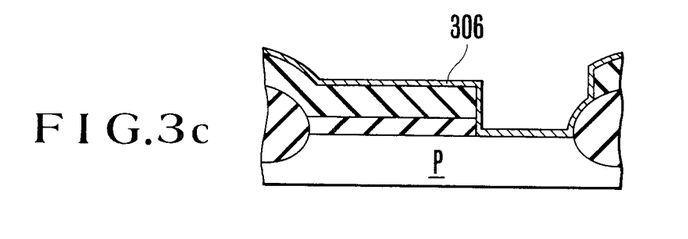
Figure 3D:
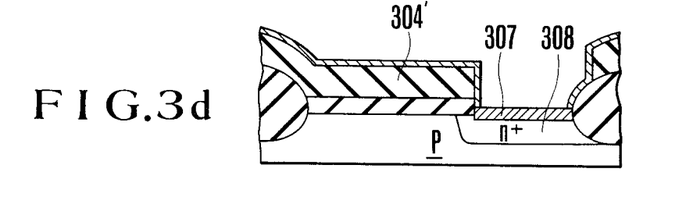

As shown in FIG. 3a, field oxide films 302 are formed on a major surface of a p-type silicon substrate 301 by an ordinary selective oxidation process, and then a gate oxide film 303 having a thickness of 400 Å is formed in an active area. Thereafter, a layer 304 of silicon nitride which is 1,700 Å thick is deposited on the films 302 and 303 by chemical vapor deposition (CVD). A portion of the silicon substrate surface wherein a direct contact is to be formed is exposed by an ordinary etching process, thus defining a direct contact hole 305 as illustrated in FIG. 3b. Subsequently, a film 306 of molybdenum which is about 100 Å thick is deposited on the entire surface as shown in FIG. 3c. The deposition of the molybdenum film 306 is effected here by sputtering, though other processes such as vacuum evaporation and CVD may be relied upon. Then, arsenic ions are implanted through the molybdenum film 306 into the silicon substrate 301 at 100 keV with a dose of $5 \times 10^{15}$ cm$^{-2}$. The arsenic ion implantation serves two purposes. The first purpose is to mix an interface between the molybdenum film 306 and the silicon substrate 301 by way of displacement due to ion beam bombardment to thereby form a mixed layer 307, as shown in FIG. 3d. The ion beam bombardment (ion-implantation) removes adverse effects, which cause non-uniform silicide formation reaction and poor reaction reproducibility, due to grains of the molybdenum film and a natural film on the exposed silicon surface. The second purpose is to dope arsenic into the exposed portion of silicon substrate 301 below the molybdenum film 306 at a high density thus forming an $n^{30}$-layer 308. As for the first purpose, it has experimentally been confirmed that a silicide of molybdenum can uniformly be made by implanting arsenic ions with a dose of about $5 \times 10^{14}$ cm$^{-2}$ or more. An actual dose in this case has been selected to be $5 \times 10^{15}$ cm$^{-2}$ in order to dope the silicon substrate with arsenic ions at a high density approximating a solid solubility without causing the junction layer to become too deep. Since the projected range of the arsenic ions in molybdenum at 100 keV is about 240 Å, only the purpose of mixing the interface can be met by implanting arsenic ions with less energy (which may be about 30 keV that makes the projected range approximate the film thickness). According to the illustrated embodiment, however, 100 keV has been selected to cause the ion dose to be more effective in the formation of the n+-layer 308. During the ion implantation, a layer 304' of silicon nitride serves as a mask to prevent arsenic ions from pentrating into the gate oxide film 303 or the silicon substrate 301 therebelow.

Figure 3E:
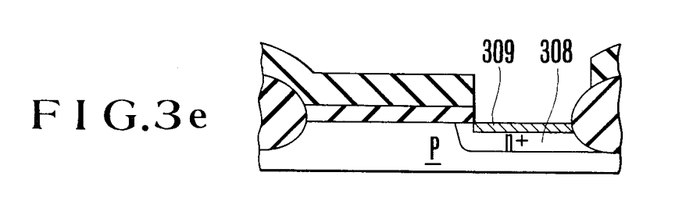

Then, the molybdenum film is annealed in a hydrogen gas atmosphere at a temperature of 500 degrees Celsius for 20 minutes to form a layer of a molybdenum silicide self-aligned with the direct contact hole. Such a low-temperature annealing process is necessary to self-align the molybdenum silicide layer with the direct contact hole, that is, with a region in which the molybdenum film is in contact with the silicon substrate. The annealing should be carried out in a non-reducing atmosphere for a few tens of minutes in a temperature range of from 400 degrees Celsius, at which the silicide starts being formed, up to about 650 degrees Celsius. If the molybdenum film were annealed at a high temperature of about 800 degrees Celsius or more, the silicide would tend to grow out of the direct contact hole onto the gate oxide layer 303, thus failing to meet the requirement that the molybdenum silicide layer be self-aligned with the direct contact hole. Thereafter, a hydrogen peroxide solution is applied to selectively remove an unreacted film of molybdenum, as shown in FIG. 3e, whereupon molybdenum silicide layer 309 and the n+-doped layer 308 which acts as a source or drain depending on a circuit design, are formed in the direct contact hole 305 is self-alignment. The molybdenum silicide layer 309 thus formed is of hexagonal MoSi$_2$ as determined by an X-ray diffraction analysis. Then, the molybdenum silicide layer 309 is annealed in a nitrogen gas atmosphere for 40 minutes at a temperature of 1,000 degrees Celsius in order to make the arsenic-implanted n+-layer 308 electrically active and molybdenum silicide layer 309 less resistant. The hexagonal molybdenum silicide layer 309 is converted by such a high-temperature annealing process into tetragonal MoSi$_2$ of a high-temperature phase. The inventors have found as a result of various experiments that the high-temperature annealing should be effected in a non-reducing atmosphere to maintain the uniformity and flatness of the silicide formed by the low-temperature annealing after the high-temperature annealing process has been effected. If the molybdenum silicide layer were annealed in a reducing atmosphere as of a hydrogen gas at a temperature of 800 degrees Celsius or more, the uniformity and flatness of the molybdenum silicide layer would be rendered extremely poor, resulting in a failure of such a process to find application in device fabrication. It has been found that the molybdenum silicide layer can be annealed in a non-reducing atmosphere such as a nitrogen gas without losing the uniformity and flatness the silicide layer has.

Figure 3F:
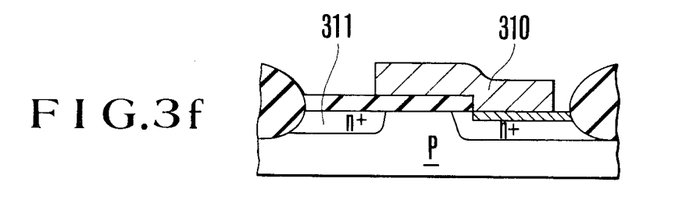

Subsequently, the silicon nitride film 304 is etched away in a hot phosphoric acid, a flm of molybdenum having a thickness of 3,000 Å is sputtered, and then a molybdenum gate 310 is formed, as shown in FIG. 3f, by an ordinary photoetching process. Thereafter, arsenic ions are implanted into the portions of the silicon substrate not masked with the molybdenum gate 301 at 100 keV with a dose of $5 \times 10^{15}$ cm$^{-2}$ to form a self-aligned n+-doped region 311, which acts as a drain or source depending on the circuit design. There is thus fabricated a depletion-type transistor in which the molybdenum gate is held in ohmic contact with the molybdenum silicide layer in the direct contact hole at the source or drain.

The first embodiment of this invention has been shown which is applied to the single direct contact structure. A fabrication process according to a second embodiment of the present invention is applicable to a construction in which direct contacts are required to be formed simultaneously to two conductive types, n+ and p+ types, as in a CMOS circuit.

Figure 4:
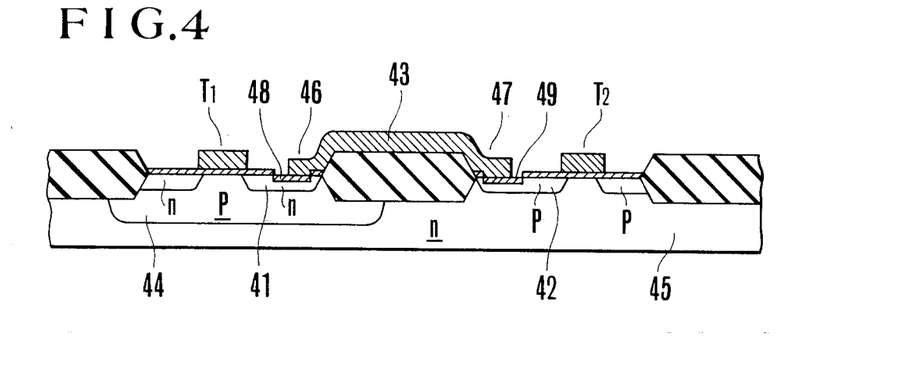
FIG. 4 is a fragmentary cross-sectional view of a CMOS structure having a gate electrode and interconnection made of a metal having a high melting point, the CMOS structure being fabricated according to another embodiment.

Such a fabrication process according to the second embodiment will be described with reference to FIG. 4. As shown in FIG. 4, on an n-type substrate 45, an interconnection 43 of molybdenum extends between a drain 41 of an n-channel transistor T$_1$ and a source 42 of a p-channel transistor T$_2$ of a CMOS inverter. The molybdenum interconnection 43 is connected to the n-channel transistor drain 41 in a p-type well 44 and the p-channel transistor source 42 at direct contacts 46, 47, respectively, through corresponding uniform silicides 48, 49 of molybdenum, as with the foregoing embodiment for the fabrication of an n-channel inverter. The molybdenum silicides 48, 49 which are self-aligned with the direct contact holes, respectively, are fabricated substantially in the same process as that according to the first embodiment. With the second embodiment, however, different steps of implanting ions for interface mixing are required to be separately effected respectively for the n-channel and p-channel regions because of the different conductive types of doped-layers in the two direct contact holes. Where interface mixing is carried out by non-dopant ions as of silicon, it can be simultaneously effected in the n-channel and p-channel regions. As an example, silicon ions can effectively be implanted for interface mixing into a film of molybdenum having a thickness of 100 Å at 30 keV with a dose of $5\times10^{15}$ cm$^{-2}$. With non-dopant ions used for interface mixing, however, high-density doping should be carried out in separate steps respectively in the contact holes prior to or subsequently to the interface mixing.

Figure 5A:
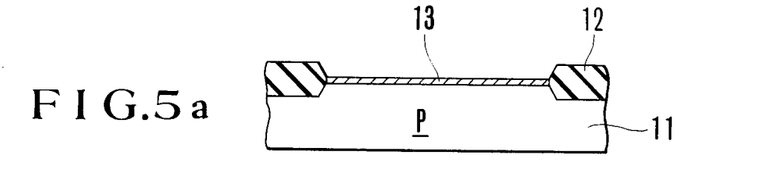
FIGS. 5a through 5g are fragmentary cross-sectional views showing progressive steps in a process of fabricating a MOSFET construction in which a gate of polycrystalline silicon and source and drain regions are covered with a silicide of metal having a high melting point according to still another embodiment.
Figure 5B:
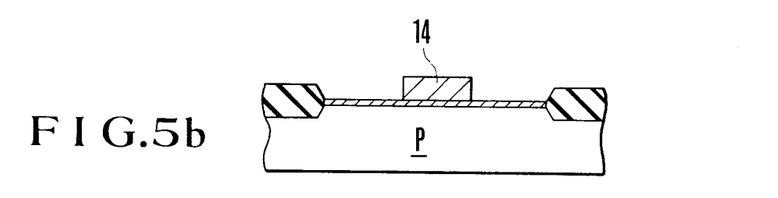
Figure 5C:
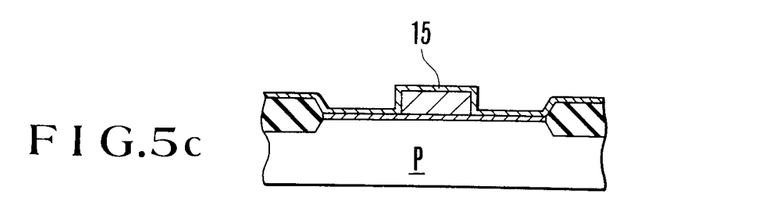
Figure 5D:
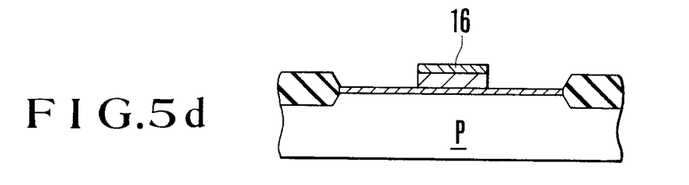
Figure 5E:
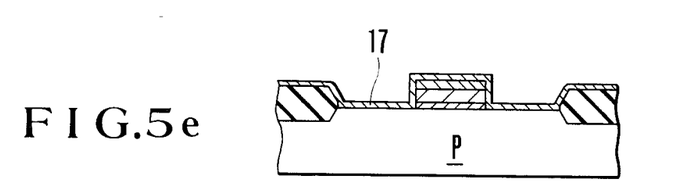
Figure 5F:
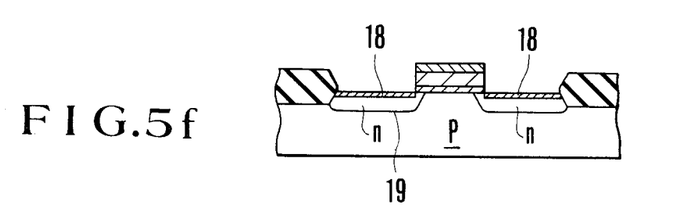
Figure 5G:
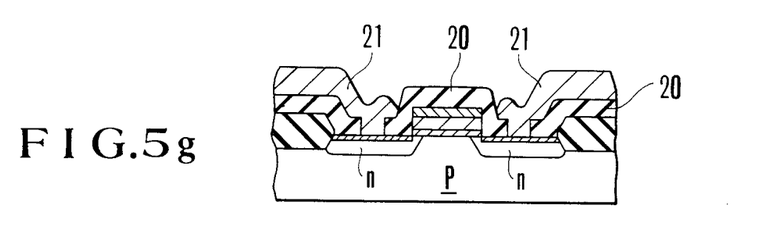

According to a third embodiment as shown in FIGS. 5a through 5g, a silicide of molybdenum is formed on a gate of an interconnection of polycrystalline silicon and on the surface of impurity-doped layers in source and drain regions. As shown in FIG. 5a, field oxide films 12 are formed on a p-type silicon substrate 11 by ordinary selective oxidation process. Then, a gate oxide film 13 having a thickness of 300 Å is formed on the silicon substrate 11 by way of thermal oxidation. As illustrated in FIG. 5b, a film of polycrystalline silicon which is 3,000 Å thick and contains phosphorus as a dopant is deposited and patterned as a gate electrode 14 by a photoetching process. Then, a relatively thick film 15 of molybdenum having a thickness of 800 Å is deposited by vacuum evaporation as shown in FIG. 5c. In the following step, arsenic ions in a dose of $5\times10^{15}$ cm$^{-2}$ are implanted at an acceleration voltage 300 keV to mix an interface between the relatively thick film 15 of molybdenum and the polycrystalline silicon. Then, the structure is annealed in a hydrogen gas atmosphere for 20 minutes at a temperature of 500 degrees Celsius to cause a silicide forming reaction at the mixed interface. Subsequently, unreacted residuals of molybdenum on the oxidized-silicon film are selectively removed by an etchant of hydrogen peroxide, whereupon, as shown in FIG. 5d, a layer 16 of molybdenum silicide having a thickness of 2,000 Å is formed in self-alignment solely on the gate of polycrystalline silicon. Then, as shown in FIG. 5e, a film 17 of molybdenum which is 400 Å thick is deposited by vacuum evaporation after the silicon substrate has been exposed at the source and drain regions. Arsenic ions in a dose of $5\times10^{15}$ cm$^{-2}$ are implanted at 150 keV to mix an interface between the molybdenum film 17 and the silicon substrate 11. The construction is then annealed in a hydrogen gas atmosphere for 20 minutes at a temperature of 500 degrees Celsius, and thereafter, is treated with an etchant of hydrogen peroxide. As a result, layers 18 of molybdenum silicide which are 1,000 Å thick are formed in self-alignment with the source and drain regions, and n-type high-density impurity-doped layers 19 are formed in self-alignment beneath the molybdenum silicide layers 18, respectively, as illustrated in FIG. 5f. The structure is now annealed in a nitrogen gas atmosphere for 20 minutes at a temperature of 950 degrees Celsius for thereby rendering the two layers of molybdenum silicide less resistive and activating the n-type impurity layers. Then, as shown in FIG. 5g, an interlayer insulating film 20 as of oxidized silicon is deposited, contact holes are defined in the film 20 in desired positions at the source and drain regions, and a layer 21 of aluminum which serves as an interconnection is deposited and patterned. The assembly is then annealed in a hydrogen gas atmosphere for about 30 minutes at 500 degrees Celsius to remedy electron-gun-induced damages which are caused upon vapor deposition of aluminum and during a process of electron beam lithography.

There is thus fabricated a MOS field-effect transistor in which the gate of polycrystalline silicon and the source and drain regions ae covered at their surfaces with the layers of molybdenum silicide. According to the present embodiment, for a molybdenum silicide of 2000 Å, a low resistance gate wiring could be realized having a sheet resistivity of 6 to 7 $\Omega$/square, and for a molybdenum silicide of 1000 Å, a low resistance source/drain layer could be realized having a sheet resistivity of 13 to 14 $\Omega$/square. The above sheet resistivity is much smaller than 30–100 $\Omega$/square of source and drain impurity layers in a semiconductor device produced by a conventional fabrication process including arsenic ion implantation and activation by way of annealing in an electric furnace. According to the present embodiment, the series of steps of vacuum evaporation of molybdenum, ion implantation, annealing in a hydrogen gas for 20 minutes at 500 degrees Celsius, and etching away unreacted molybdenum films is carried out twice to form different thicknesses of molybdenum layers on the gate of polycrystalline silicon and the source and drain regions. Where the sheet reistivities may be equal to each other, the above series of steps can be carried out only once. While in the illustrated embodiment, the layers of molybdenum silicide are formed on both the gate of polycrystalline silicon and the source and drain regions, the layer of molybdenum silicide may be formed on either the gate of polycrystalline silicon or the source and drain regions. Since the molybdenum silicide layer which is uniform and has much fewer grain boundaries serves as a barrier metal in the contact of an aluminum/molybdenum silicide/n$^+$-Si construction, no aluminum alloy spikes would be caused during annealing in a hydrogen gas atmosphere at 500 degrees Celsius, a temperature which is sufficiently high to remedy electron-gun-induced damages.

Although certain preferred embodiments of the invention have been shown and described in detail, it should be understood that various changes and modifications may be made therein without departing from the scope of the appended claims.

What is claimed is:

1. A process forming a layer of metal silicide having a high melting point on a major surface of a semiconductive substrate of silicon, comprising the steps of:
    forming an insulating film on the major surface of the silicon substrate;
    defining an opening in said insulating film;
    thereafter depositing a layer of molybdenum over said major surface of the silicon substrate;
    implanting ions so as to mix an interface between the molybdenum layer and the silicon substrate;
    thereafter heating a resulting structure of said silicon substrate, insulating film and molybdenum layer in a temperature range of from 400 to 650 degrees Celsius to effect a silicide forming reaction for the molybdenum at said opening;
    selectively etching away an unreacted layer of said molybdenum on said insulating film so as to self-align the silicide layer of molybdenum with said opening; and
    then annealing said silicon layer in a non-reducing gas atmosphere at a temperature ranging from 800 to 1,100 degrees Celsius for repairing damage induced by ion implantation and lowering silicide resistivity.

2. A process according to claim 1, wherein said ions comprise dopant ions of group III or V elements to fabricate a double-layer construction including a uniform layer of molybdenum silicide and a doped layer which are self-aligned with said opening.

3. A process according to claim 1, wherein said ions comprise non-dopant ions of silicon to form a uniform layer of molybdenum silicide which is self-aligned with said opening.

4. A process according to claim 1, wherein dopant ions such as boron and non-dopant ions such as silicon are doubly ion-implanted to fabricate a double-layer structure including a uniform layer of molybdenum silicide and a thin dopant layer which are self-aligned with said opening.

5. A process of fabricating a metal-oxide semiconductor transistor including a gate interconnection of molybdenum and connected to an impurity-doped region of a major surface of a semiconductor substrate of silicon, comprising the steps of:

forming insulating films consisting of gate oxide and mask layer for the following ion implantation on the major surface of the silicon substrate;

defining an opening in said insulating films to expose a portion of said silicon substrate as a prospective source region;

depositing a layer of molybdenum on said insulating films and said opening portion of said silicon substrate;

implanting dopant ions of group III or V elements, having an opposite conductivity type to said silicon substrate into said silicon substrate through the molybdenum layer to mix an interface between said layer and said silicon substrate and to dope impurities in said layer and the silicon substrate therebeneath for formation of a source region;

heating the construction at a temperature ranging from 400 to 650 degrees Celsius to effect a silicide forming reaction;

thereafter etching away an unreacted layer of molybdenum on said insulating films to form a layer of molybdenum silicide selectively on said exposed portion of said silicon substrate;

heating the construction in a non-reducing gas atmosphere at a temperature in the range from 800 to 1,100 degrees Celsius to make implanted ions electrically active and to make said layer of molybdenum silicide less resistive without disturbing uniformity and flatness of said layer of molybdenum silicide;

sputtering molybdenum to a predetermined thickness and patterning said molybdenum for a gate electrode wiring being held in direct contact with a portion of a surface of said layer of molybdenum silicide; and thereafter implanting dopant ions of group III or V elements, having an opposite conductivity type to said silicon substrate, to form a drain region using said gate electrode wiring of molybdenum as a mask, and then activating the implanted ions.

6. A process for fabricating an ohmic electrode in which an electrode interconnection of aluminum is held in contact with a portion in a region, selectively doped with impurities, of a principal surface of a semiconductive substrate of silicon, comprising the steps of:

forming an insulating film on the impurity-doped layer of the silicon substrate;

defining an opening in said insulating film to expose said impurity-doped layer;

thereafter forming a layer of molybdenum on said insulating film and said exposed impurity-doped layer;

implanting dopant ions having the same conductivity type as said impurity doped layer, non-dopant ions such as silicon and argon ions, or both said dopant ions and non-dopant ions through said layer of molybdenum into said inpurity-doped layer to mix an interface between said layer of molybdenum and said impurity-doped layer;

annealing the construction at a temperature ranging from 400 to 640 degrees Celsius;

thereafter etching away an unreacted layer of molybdenum to form a layer of molybdenum silicide selectively on said exposed impurity-doped layer;

annealing the construction in a non-reducing atmosphere in a temperature range of from 800 to 1,100 degrees Celsius; and forming an electrode interconnection of aluminum having a predetermined thickness and held in direct contact with a portion of a surface of said layer of molybdenum silicide.

7. A process of fabricating a silicon metal-oxide semiconductor field-effect transistor, comprising the steps of:

forming a field region and a gate insulating film in an active region on one major surface of a semiconductor substrate of silicon;

forming a silicon film doped with an impurity on said gate insulating film and patterning said silicon film so as to form a gate electrode wiring;

etching said gate insulating film using said gate electrode wiring as a mask so as to expose portions of said surface for forming source and drain regions, and then depositing a layer of molybdenum on the entire surface of the obtained structure;

ion-implanting through said layer of molybdenum dopant ions of a group III or V element or double ion-implanting through said metal layer of the dopant ions and non-dopant ions such as silicon ions so as not only to mix an interface between said layer of molybdenum and the portions of exposed surface of said silicon substrate for forming said source and drain regions as well as an interface between said molybdenum layer and the surface of said patterned silicon film, but also to form an impurity-doped layer for forming said source and drain regions directly beneath mixed interfaces of said silicon substrate;

annealing the structure at a temperature of 400 to 650 degrees Celsius so as to cause siliciding of the layer of molybdenum only at said interfaces, and then selectively etching away an unreacted portion of said layer thereby forming a layer of a molybdenum silicide in self-alignment with the portions of said surface of said silicon substrate for forming said source and drain regions and for forming with said patterned silicon film said gate electrode wiring; and annealing the structure at a temperature of 800 to 1,100 degrees Celsius in a non-reducing gas atmosphere so as to activate the implanted ions and to repair damage caused by implantation of the ions.

* * * * *